United States Patent [19]

Grimm et al.

[11] Patent Number: 5,302,208
[45] Date of Patent: Apr. 12, 1994

[54] VACUUM COATING INSTALLATION

[75] Inventors: Helmut Grimm, Darmstadt; Thomas Krug, Rodenbach; Andreas Meier, Pfulingen; Klemens Ruebsam, Jossgrund; Gerhard Steiniger, Ronneburg, all of Fed. Rep. of Germany; Mika Gamo, Kasukabe, Japan; Mamoru Sekiguchi, Kawaguchi, Japan; Mitsuru Kano; Hiroyuki Yasujima, both of Tokyo, Japan; Takashi Miyamoto; Noboru Sasaki, both of Sugito, Japan

[73] Assignees: Leybold Aktiengesellschaft, Hanau, Fed. Rep. of Germany; Toppan Printing Co., Ltd, Tokyo, Japan

[21] Appl. No.: 924,149

[22] Filed: Aug. 3, 1992

[30] Foreign Application Priority Data

Feb. 8, 1992 [DE] Fed. Rep. of Germany ....... 4203632

[51] Int. Cl.$^5$ .................... C23C 14/28; C23C 14/30
[52] U.S. Cl. ............................ 118/718; 118/723 VE; 118/723 EB; 118/723 MW; 118/726
[58] Field of Search ............... 118/718, 723 EB, 726, 118/723 MW, 723 VE

[56] References Cited

U.S. PATENT DOCUMENTS

| 898,381 | 6/1992 | Geisler et al. | |
|---|---|---|---|
| 3,854,442 | 12/1974 | Adam et al. | 34/72 |
| 4,403,002 | 9/1983 | Akashi | 118/726 |
| 4,511,594 | 4/1985 | Yanai | 118/723 |
| 4,532,888 | 8/1985 | Neumann | 118/726 |
| 4,611,121 | 9/1986 | Miyamura et al. | |
| 4,683,838 | 8/1987 | Kimura | 118/726 |
| 4,724,796 | 2/1988 | Ranke | 118/726 |
| 4,987,346 | 1/1991 | Katzschner et al. | |
| 5,070,811 | 12/1991 | Feuerstein | 118/726 |
| 5,076,203 | 12/1991 | Vaidya | 118/726 |
| 5,107,791 | 4/1992 | Hirokawa | 118/719 |

FOREIGN PATENT DOCUMENTS

| 0263880 | 4/1988 | European Pat. Off. | |
|---|---|---|---|
| 0271682 | 6/1988 | European Pat. Off. | |
| 2141723 | 3/1973 | Fed. Rep. of Germany | |
| 4039352 | 6/1992 | Fed. Rep. of Germany | |
| 204947 | 12/1983 | German Democratic Rep. | 118/726 |
| 61-74142 | 4/1986 | Japan | 118/726 |
| 61-94239 | 5/1986 | Japan | 118/726 |
| 61-135126 | 6/1986 | Japan | 118/723 |
| 62-287072 | 12/1987 | Japan | 118/723 |
| 2-056897 | 2/1990 | Japan | 118/723 |
| WO9112353 | 8/1991 | PCT Int'l Appl. | |
| 515833 | of 0000 | U.S.S.R. | |

OTHER PUBLICATIONS

T. Krug, K. Rübsam: Die neue "gläserne" Lebensmittelverpakung in neue verpackung, Hüthig-Verlag, 1991.

Primary Examiner—Richard Bueker
Attorney, Agent, or Firm—Felfe & Lynch

[57] ABSTRACT

The invention relates to a vacuum coating installation comprising a container (9) in which is disposed the material (10) to be vaporized, for example SiO. The vaporization of the material (10) herein takes place by means of an electron beam gun (11) or by means of a vaporization oven. Opposing the surface of the material to be vaporized (10) is provided a synthetic film (5) to be coated which is transported further by means of a transport arrangement (4, 6, 22 to 27). Into the space between the material (10) to be vaporized and the material (5) to be coated a microwave is irradiated from an horn antenna (13).

20 Claims, 4 Drawing Sheets

VACUUM COATING INSTALLATION

The invention relates to a vacuum coating installation according to the preamble of Patent Claim 1.

Transparent films of synthetic material are used to an increasing degree for packaging food items. These films comprise primarily polymer synthetic materials which are indeed flexible but which have the disadvantage that they are permeable to aromas and flavors, to water or oxygen. If a diffusion of such substances is to be excluded, in general aluminum foils or synthetic films on which aluminum has been vapor-deposited are used for this reason. However, these have the disadvantage that they are relatively difficult to dispose off and not transparent to microwaves and light. Because of the availability of microwave ovens in nearly all households in industrialized countries, however, the microwave transparency of the packaging material is in many cases of decisive importance.

In order to combine the advantages of the synthetic films transparent to microwaves with the advantages of aluminum foils which form an absolute barrier for aromas and flavors, water and oxygen, it is already known to coat polymer films with metal oxides. Herein silicon oxide plays a special role as coating material. The synthetic films coated with silicon oxide with respect to the laminate structure and the barrier behavior relative to oxygen, water vapor, and aroma have similar properties as synthetic films coated with aluminum foil or with aluminum.

However, coating synthetic films with metal oxides such as $SiO_x$ requires a process technique which differs strongly from the conventional coating techniques because, in contrast to metals, metal oxides must be vaporized out of the solid phase.

The production of $SiO_x$ coatings takes place through the vaporization of SiO by means of a vaporization oven or by means of electron beam vaporization (cf. T. Krug, K. Rübsam: Die neue "gläserne" Lebensmittelverpackung in "neue verpackung", Hüthig-Verlag, 1991). Since SiO sublimates—i.e. vaporizes directly from the solid state and not by way of a liquid phase—a special crucible is necessary. To achieve film band speeds of a few m/s which represents a prerequisite for an economical production at acceptable cost, crucibles for vaporization temperatures of approximately 1,350° C. are required. The $SiO_{x=1}$ vapor oxidizes in a controlled reactive atmosphere and reaches a degree of oxidation of $x=1.5$ to 1.8 on a film to be coated. $SiO_x$ layers thinner than 2,000 Å have the advantage that they are easily flexible. Moreover, $SiO_x$ is chemically inert and corrosion resistant against water.

SiO can be vaporized either by means of a vaporization oven or with the aid of an electron beam since it has a relatively high vapor pressure. In order to achieve the requisite higher evaporation rates with other metal oxides also, such as for example MgO or mixtures of metal oxides, for example $MgO+SiO_2$, however temperatures of 1,800° C. or more are necessary. These can only be reached with a high degree of efficiency with electron beam vaporizers. The adhesion, transparency, and barrier properties of a coated film depend essentially on the speed with which the vaporized metal oxides impinge on the film.

The invention is based on the task of improving the properties of a metal oxide coating on a synthetic film.

The task is solved with an arrangement according to the features of Patent Claim 1.

The advantage achieved with the invention comprises in particular that the vaporized atoms and molecules are ionized by the microwaves or are at least excited so that they form a coating with improved properties on the synthetic film. Therein the rate of growth of the layer is about 5,000 to 10,000 Å/s. The vapor pressure of the evaporation material in the space between the evaporation crucible and the material to be coated is about $10^{-2}$ mbar to 1 mbar and is therefore sufficient that a plasma is fired with the aid of microwaves. An auxiliary gas being required as is the case with sputtering or plasma chemical vapor deposition (CVD) is not necessary. However, gases such as for example $O_2$, $H_2O$ or $CO_2$ can also be introduced into the coating chamber during the coating. The reaction of these gases with the vaporized material is increased or made possible by the plasma.

An embodiment of the invention is depicted in the drawing and is described in further detail in the following.

BRIEF DESCRIPTION OF THE DRAWINGS

In FIG. 1 a perspective view of a high rate vaporization installation 1 according to the invention is shown. This installation comprises two chambers 2, 3 of which the one chamber 2 comprises a feeder roller 4 for an uncoated synthetic film 5 as well as a take-up roller 6 for a coated synthetic film 7, while the other chamber 3 is equipped with the vaporization installation 8 proper. Of the second chamber 3 only a small portion is depicted; the greater portion is omitted in order to show the vaporization installation 8 better. This vaporization installation 8 comprises essentially a crucible 9 with the material 10 to be vaporized, two electron beam guns 11, 12 and a microwave transmitter of which only part of a horn antenna 13 is evident.

Figure 1:
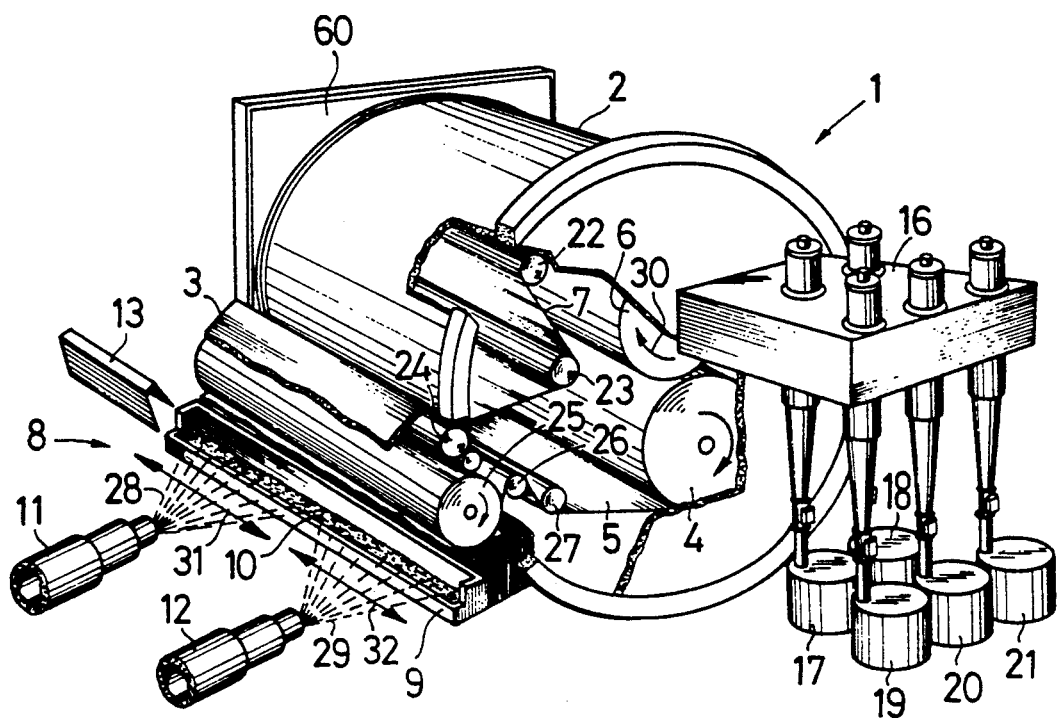
FIG. 1 a perspective view of a high rate vaporization installation according to the invention for synthetic films.

Onto the first chamber 2 a suction port 16 is flanged which carries several vacuum pumps 17 to 21. With these vacuum pumps the chamber is pumped from 1 bar down to a pressure of approximately $10^{-2}$ mbars. The chamber 3 is also provided with a vacuum pump which, however, is not shown. This vacuum pump is preferably a diffusion pump which generates a vacuum of $10^{-4}$ mbars. For the evacuation of the electron beam guns 11, 12 a turbomolecular pump (not shown) can be provided. The two chambers 2, 3 are connected with each other through small slits which are necessary in order to transport the film 5 to be coated over guide rollers 22 to 27 from one chamber 2 or 3, respectively into the in each instance other chamber 3 or 2, respectively. The pressure difference between the two chambers 2, 3 accordingly is two orders of magnitude.

Not depicted is a magnetic deflection unit which deflects the horizontally impinging electron beams 28, 29 of the electron beam gun 11, 12 perpendicularly onto the material 10 to be vaporized. By 60 is denoted a plate which is part of an arrangement connected with essential parts of the entire installation. These parts can be brought out of the chamber 2 so that the chamber is easier to maintain.

The coating of the synthetic film 5 in the installation 1 is described in the following.

A driving motor (not shown) drives the take-up roller 6 in the direction of the arrow 30, in which the end of the coated film 7 is inserted. Hereby the uncoated film 5 is wound off the feeder roller 4 and placed onto the coating roller 25 over the guide rollers 26, 27. There the film 5 is bombarded with material particles which are vaporized due to the heating of the coating material 10 by the electron beams 28, 29 and are deposited on the film 5. The electron beams 28, 29 are moved back and forth at least in one direction, which is indicated by the arrows 31, 32, so that the material 10 is vaporized over the entire length of the crucible 9. With the horn antenna 13 depicted symbolically microwave energy is introduced into the space between the roller 25 and the crucible. This energy ionizes or at least excites the material particles to be vaporized in the crucible 9. Hereby between crucible 9 and roller 25 a brightly glowing plasma cloud develops which is extinguished as soon as the microwaves are switched off.

Figure 2:
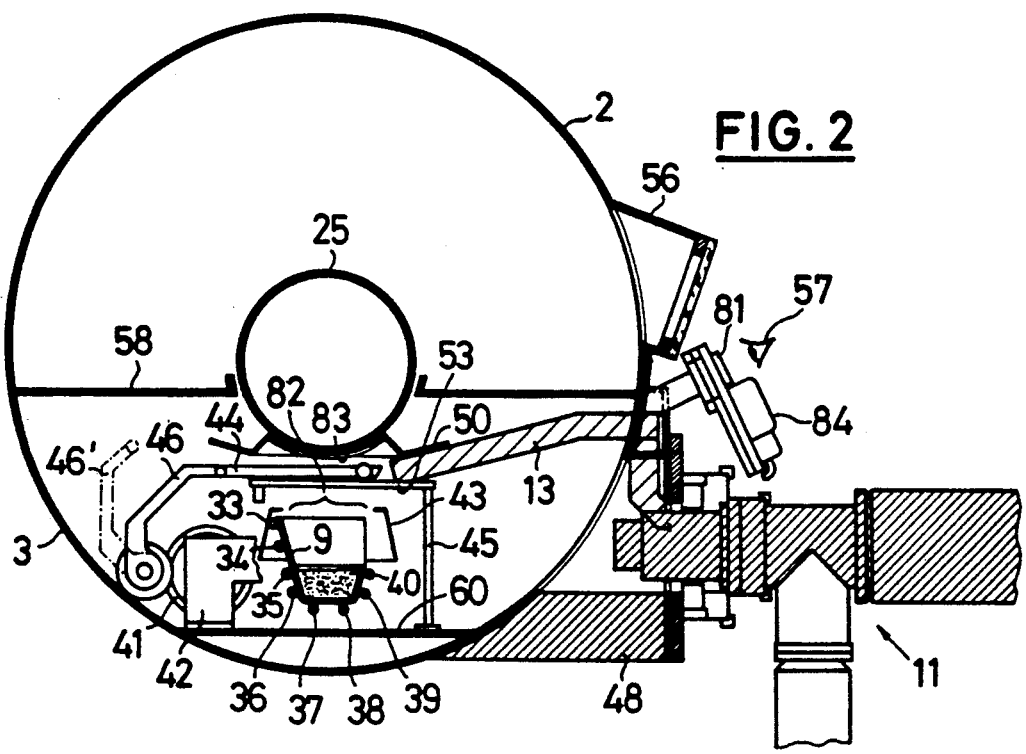
FIG. 2 a partially cut lateral view of the high rate vaporization installation according to FIG. 1.

In FIG. 2 a section through the two chambers 2, 3 of FIG. 1 is depicted wherein however the chambers 2, 3 are modified to the extent that they are now disposed on a common circumference and are separated from each other by a visible separating wall 58. The upper chamber 2 has a window 56 through which an observer can inspect the chamber 2. The chamber 3 can also be observed through a window 81 below which is disposed a stroboscope 84 symbolized by the eye 57. For the sake of simplicity, of the different rollers only the coating roller 25 is depicted. It can be recognized that the crucible 9 is surrounded by cooling water pipes 33 to 40. In addition, next to the crucible 9 is disposed a large magnet coil 41 connected with a yoke metal sheet 42 of which only part is evident. Around the crucible 9 a crucible cover 43 is provided above which a movable slide 44 is disposed resting on a bearing surface 53 which is braced on a bottom 60 via supports 45. The crucible cover 43 has an opening 82 in the center through which the vaporized particles move from the crucible 9 to the roller 25. By means of a rotary arm 46 the slide 44 can be moved under the roller 25 and away from it. It functions to interrupt or release the particle stream from the crucible 9 to the roller 25. The electron beam gun flanged to the chamber 3 via a flange 48 is denoted by 11. Above the electron beam gun 11 and in the chamber 3 is disposed the microwave horn antenna 13 which transmits microwaves into the space between crucible 9 and roller 25.

Figure 3:
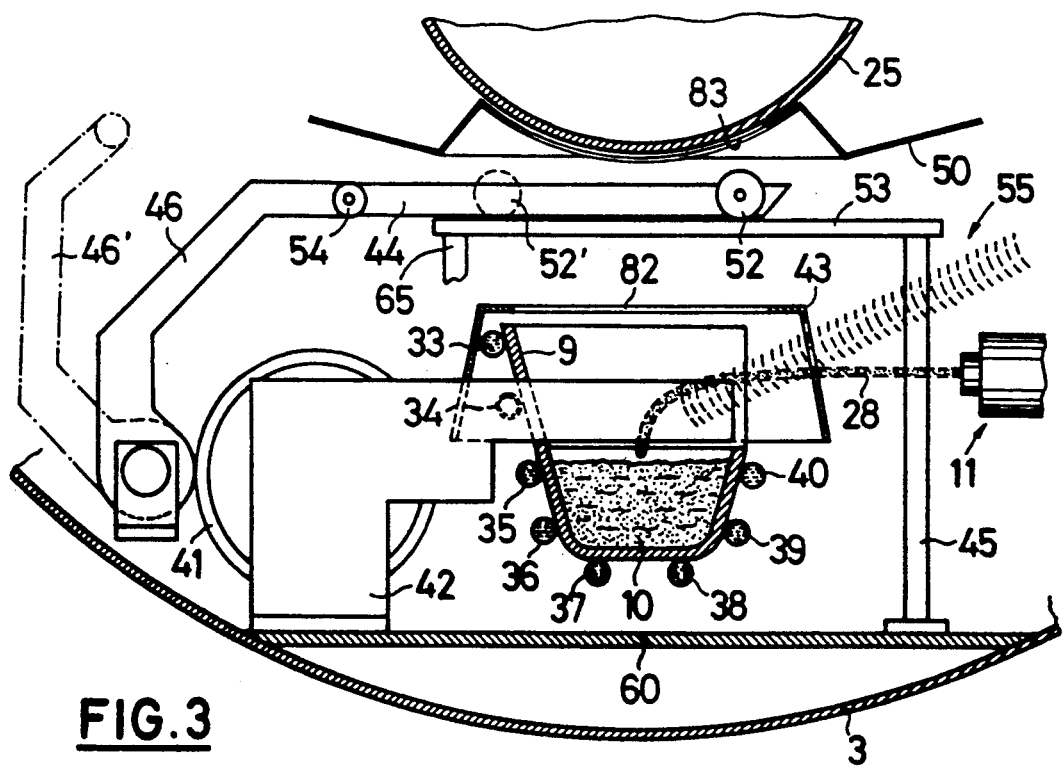
FIG. 3 an enlarged representation of a section from FIG. 2.

FIG. 3 shows an enlarged section from FIG. 2. Herein a cover metal sheet 50 with an opening 83 can be seen below the roller 25 which serves for laterally limiting the particle stream; additionally, it is evident that the slide 44 is supported on roller bearings 52 resting on the bearing surface 53 which is connected with the supports 45. The retracted position of the roller bearing 52 is denoted by 52'. A second support 65 is shown in a broken section. The rotary arm 46 is coupled to the slide 44 via an articulation 54. The yoke metal sheet 42 is completely depicted so that it can be seen that it extends over the whole width of the crucible 9.

Figure 4:
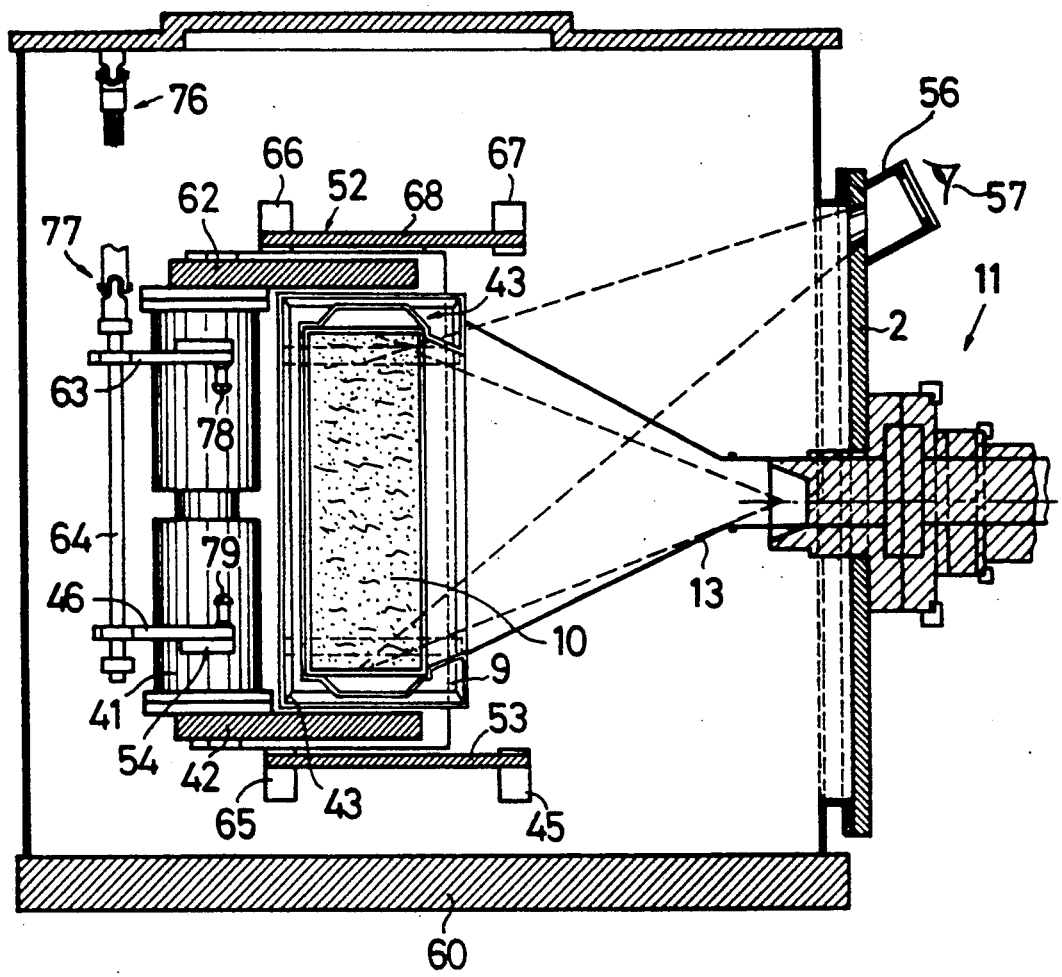
FIG. 4 a top view onto the vaporization installation according to FIG. 2.

In FIG. 4 is shown the arrangement of FIG. 2 in a view from above wherein some parts have been omitted and others have been added. With its opening the horn antenna 13 extends in the direction of the crucible 9 to a region closely above it. The yoke metal sheet 42 is opposed by a second yoke metal sheet 62 so that between the two yoke metal sheets 42, 62 a magnetic field is formed which deflects the electron beam 28 coming from the electron gun 11 onto the surface of the material 10 disposed in the crucible 9. In addition to the arm 46, a second arm 63 is provided which is disposed on the same axle shaft 64 as the arm 46.

In can additionally be seen in FIG. 4 that the support 45 has assigned to it a second support 65 wherein both supports 45, 65 are connected with one another via the bearing surface 53. On the opposing side of the crucible 9 a corresponding arrangement is provided with the reference numbers 66, 67, 68. The roller bearing 52 (FIG. 3) rolls on the bearing surface 53. The same applies to a second roller bearing (not shown) which rolls on the bearing surface 68. The slide 44 not visible in FIG. 4 is held by pins 78, 79 which engage the slide 44. By 76, 77 universal joints are denoted which are driven by a motor (not shown).

Figure 5:
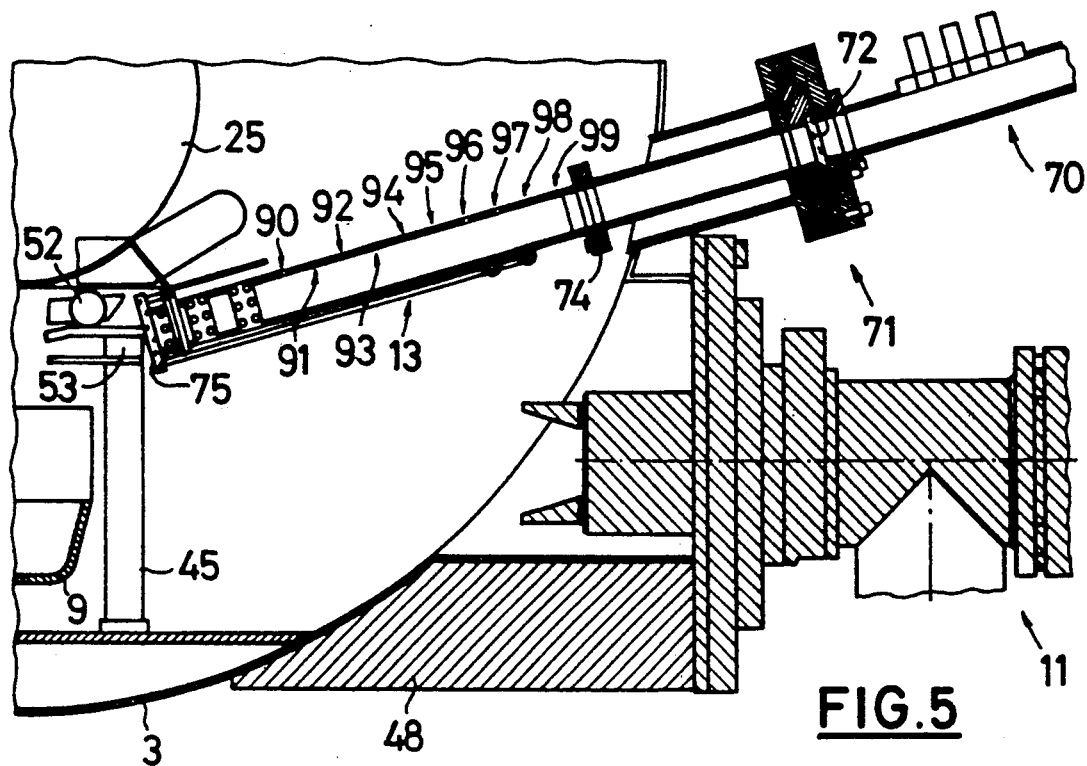
FIG. 5 a lateral view of an electron beam gun and a microwave horn antenna.

In FIG. 5 the horn antenna 13 on housing 3 is shown once again in detail in an enlargement of a section of FIG. 2. It can be seen that the horn antenna 13 extends with its end 75 to a region very close to the crucible 9. The horn antenna 13 is connected to a tuner 70 via a window 71 representing an interface between vacuum and air and which comprises a quartz pane 72 through which microwaves can penetrate. During the vaporization of the material 10 before a second quartz window 75 i.e. in the chamber 3, a vapor pressure of the evaporation material of $10^{-2}$ mbars or more obtains so that the plasma above the crucible 9 fires merely due to the penetrating microwaves. Between the windows 75 and 72, consequently in the horn antenna 13 itself, a pressure of $10^{-4}$ mbars obtains so that the plasma cannot fire. In order for a pressure of $10^{-4}$ mbars to develop on the upper side of the horn antenna 13, holes 90 to 99 are provided. The underside of the horn antenna 13, in contrast, has no holes. The space between the windows 75 and 72 is consequently connected with the background vacuum of the installation.

Figure 6:
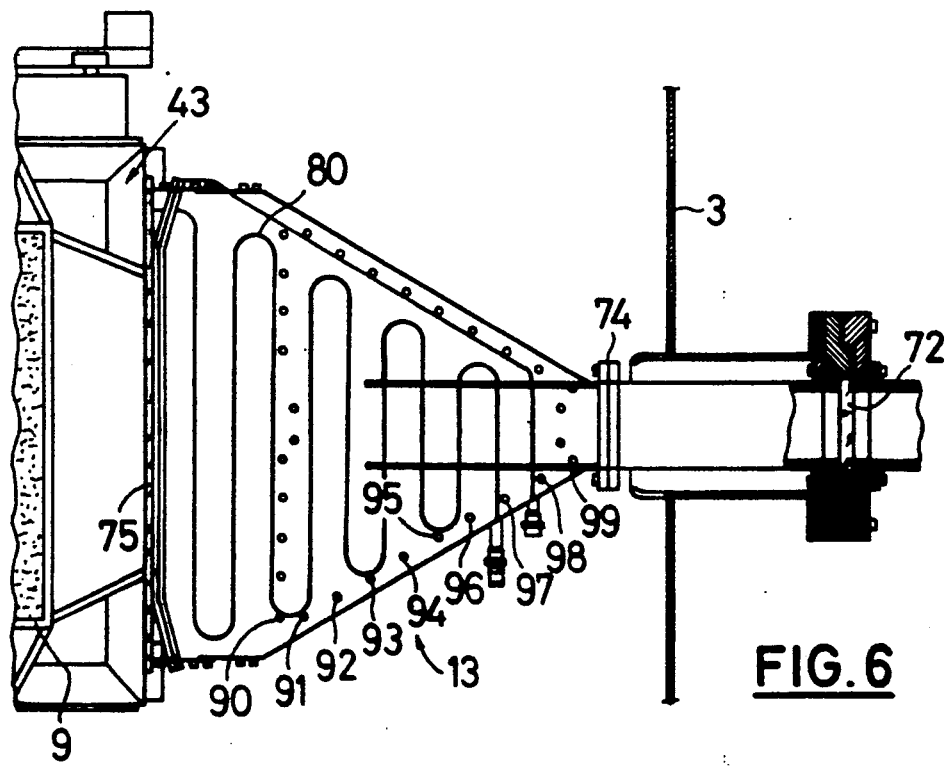
FIG. 6 a top view onto the microwave horn antenna of FIG. 5.

A top view onto the horn antenna 13 depicted essentially in isolation is shown in FIG. 6. A soldered-on snake-form cooling line 80 as well as the holes 90 to 99 can herein be seen.

The electron beam 28 of the electron beam gun 11 is moved or scanned by a control arrangement which is disposed in the electron beam gun 11 itself over the surface of the crucible content 10, i.e. over the material 10 to be vaporized. The vaporized material is subsequently excited by the microwaves 55 whose radiation power is nearly completely absorbed by the particles of the vaporized material, i.e. a plasma is generated. Other than in already known arrangements in which a horn antenna is used for introducing microwave energy into a plasma (cf. for example U.S. Pat. Nos. 4,611,121, 4,987,346), the plasma is generated from the vapor of the evaporation material 10 and no additional gases like Argon, Oxygen etc. or organosilane gases as used for chemical vapor deposition (CVD) have to be inserted. In that arrangement no electron cyclotron resonance (ECR) takes place, but rather the particles are only excited or ionized to a greater or lesser degree. ECR operation would not be possible with the arrangement according to FIG. 1 to 6 because for this a magnetic field of a strength would be required which exceeds the strength of the magnetic field generated by the coil 41. In ECR operation the electrons are forced by a magnetic field into a circular orbit while in the present case the magnetic field has solely the purpose of deflecting downward the electrons of the electron beam by approximately 90°.

The excitation which the particles experience through the microwaves is also sufficient without an ECR effect to increase the ionization and excitation rate of the vaporized particles and to improve the vapor deposited layers. As experience has shown, on the film to be coated a negative polarity develops which accelerates positive ions from the plasma generated by the microwaves onto the film so that they adhere there. The negative charging of the film is caused essentially by the scattered electrons of the electron beam 28 which reach the film directly from the surface of the material 10 to be melted.

The ECR operation between the surface of the material to be melted and the film would also not be possible with an additional magnetic field which for example would be disposed in the vicinity of the film and consequently above the magnetic field generated by the coil 41 because this magnetic field would influence the paths of the electrons of the electron beam 28. A shielding between the two magnetic fields could also not be realized because, with the exception of superconductors, there are no materials having vanishing permeability. Accordingly, no material exists which at normal temperatures can be considered to be a magnetic isolator. Utilizing the remaining option, namely that of magnetic field compensation, would be too expensive.

The microwaves 55 used preferably have the customary industry frequency of 2.45 GHz. The electron beam transmitted by the electron beam gun 11 has a current strength of 1 to 5 A. In order for this beam to be deflected by approximately 90 degrees, the magnetic field generated by the coil 41 must have a strength of $5*10^3$ A/m.

It is clear that instead of nearly horizontally running electron beam guns which may be bent into the container through a magnetic field also obliquely running electron beam guns can be provided which impinge directly onto the material to be vaporized. In this case a deflecting magnetic field can be omitted.

In FIGS. 3 to 5 the horn antenna by which the microwaves are irridiated is arranged on the same side as the electron beam gun. It is clear, however, that the horn antenna and the electron beam gun may also be arranged on opposite sides of the crucible. For instance, with respect to the presentation of FIG. 3, the electron beam gun may be orientated from the left upper side to the right lower side so that the electron beams need not be deviated by a magnet, but will impinge directly on the surface of the melting charge. In this case the microwave could be irridiated from the right side and from any direction.

We claim:

1. Vacuum coating installation, comprising:
   a container in which is contained a material to be vaporized,
   a vaporization arrangement for vaporizing the material disposed in the container,
   material to be coated disposed at a distance from the material to be vaporized,
   a microwave transmitter which transmits microwaves into the space between the material to be vaporized and the material to be coated,
   characterized in that the material to be coated is a sheet or foil having a width, the which of the container is at least as large as the width of the sheet, and the microwave transmitter comprises a horn antenna with an opening the width of which corresponds substantially to the width of the container.

2. Vacuum coating installation as stated in claim 1, characterized by a transport arrangement for the material to be coated.

3. Vacuum coating installation as stated in claim 1, characterized in that the material to be coated is a synthetic film.

4. Vaccum coating installation as stated in claim 2, wherein the material to be coated is a synthetic film and which includes a transport arrangement for the synthetic film, characterized in that the transport arrangement comprises a feeder roller, a take-up roller, and a coating roller wherein that area of the synthetic film is coated which faces the material to be vaporized.

5. Vacuum coating installation as stated in claim 4, characterized in that two vacuum chambers are provided of which the one vacuum chamber has a significantly higher vacuum than the other chamber, and that in the one chamber with the lower vacuum the feeder roller, the take-up roller, and the coating roller are disposed, while in the chamber with the higher vacuum the container with the material to be vaporized is provided.

6. Vacuum coating installation as stated in claim 5, characterized in that between the two chambers an opening is provided through which the synthetic film to be coated can be transported from one chamber to the other chamber and conversely.

7. Vacuum coating installation as stated in claim 1, characterized in that the container extends essentially over the entire width of a synthetic film web.

8. Vacuum coating installation as stated in claim 1, characterized in that the vaporization arrangement is an electron beam gun which outputs an electron beam parallel to and at a distance from the surface of the material to be vaporized and which installation includes means for providing a magnetic field which deflects the electron beam onto the surface of the material.

9. Vacuum coating installation as stated in claim 1, characterized in that the vaporization arrangement is an electron beam gun which outputs an electron beam with a direct path to the surface of the material to be vaporized.

10. Vacuum coating installation as stated in claim 1, characterized in that the microwave transmitter comprises a horn antenna with a rectangular opening wherein the greater side of the rectangle corresponds essentially to the width of the container for the material to be vaporized.

11. Vacuum coating installation as stated in claim 10, characterized in that the horn antenna comprises a window transparent to microwaves at its emitting end and a window transparent to microwaves at the connection site to the microwave transmitter.

12. Vacuum coating installation as stated in claim 10, characterized in that the horn antenna is provided with holes at its upper side, which create a connection to a vacuum chamber.

13. Vacuum coating installation as stated in claim 11, characterized in that in the space before the window of the emitting end a pressure of $10^{-2}$ mbars obtains while between the two windows a pressure of $10^{-4}$ mbars obtains.

14. Vacuum coating installation as stated in claim 10, characterized in that the horn antenna is disposed above the electron beam gun and its longitudinal axis is inclined toward the container.

15. Vacuum coating installation as stated in claim 7, characterized in that the container has a U-form cross section with an aperture for the entrance of an electron beam.

16. Vacuum coating installation as stated in claim 8, characterized in that the magnetic field is generated by means of a coil through which current flows, which is disposed on a yoke with two lateral arms wherein these lateral arms encompass the container in such a way that the magnetic fields extending between them stands perpendicularly to the longitudinal direction of the electron beam.

17. Vacuum coating installation as stated in claim 4, characterized in that a movable shutter is provided between the container and the coating roller.

18. Vacuum coating installation as stated in claim 1, characterized in that the material in the container is a metal oxide.

19. Vacuum coating installation as stated in claim 18, characterized in that material is MgO or SiO.

20. Vacuum coating installation as stated in claim 1, which includes an electron beam gun and characterized in that the microwave transmitter comprises a horn antenna which is placed opposite to the electron beam gun.

* * * * *